(12) United States Patent
Kim

(10) Patent No.: US 11,375,646 B2
(45) Date of Patent: Jun. 28, 2022

(54) DISPLAY MODULE

(71) Applicant: SAMSUNG DISPLAY CO., LTD., Yongin-si (KR)

(72) Inventor: Jung Hoon Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/022,438

(22) Filed: Sep. 16, 2020

(65) Prior Publication Data

US 2021/0242188 A1 Aug. 5, 2021

(30) Foreign Application Priority Data

Feb. 4, 2020 (KR) .................. 10-2020-0013362

(51) Int. Cl.
*H05K 7/20* (2006.01)
*H01L 25/16* (2006.01)
*H05K 1/18* (2006.01)
*H01L 23/58* (2006.01)

(52) U.S. Cl.
CPC ....... *H05K 7/20963* (2013.01); *H01L 25/167* (2013.01); *H05K 1/189* (2013.01); *H05K 7/2099* (2013.01); *H01L 23/58* (2013.01); *H05K 2201/10037* (2013.01); *H05K 2201/10128* (2013.01); *H05K 2201/10219* (2013.01)

(58) Field of Classification Search
CPC ............ H05K 7/20963; H05K 7/2099; H05K 11/189; H05K 2201/10037; H05K 2201/10128; H05K 2201/10219; H01L 25/167; H01L 23/58
See application file for complete search history.

(56) References Cited

U.S. PATENT DOCUMENTS

| | | | |
|---|---|---|---|
| 9,354,733 B2 | 5/2016 | Kim et al. | |
| 10,050,091 B2 | 8/2018 | Lee et al. | |
| 10,267,545 B2* | 4/2019 | Wang | F25B 21/04 |
| 2015/0075186 A1* | 3/2015 | Prajapati | F25B 21/02 |
| | | | 62/3.7 |

FOREIGN PATENT DOCUMENTS

| | | |
|---|---|---|
| JP | 2015119545 A | 6/2015 |
| KR | 100730078 B1 | 6/2007 |
| KR | 1020170005245 A | 1/2017 |
| KR | 102077140 B1 | 2/2020 |

* cited by examiner

*Primary Examiner* — Mukundbhai G Patel
(74) *Attorney, Agent, or Firm* — Cantor Colburn LLP

(57) ABSTRACT

A display module includes a display panel on which an image is displayed, a driver chip which supplies a driving voltage to the display panel, a thermoelectric element disposed on a first surface of the display panel and which overlaps the driver chip in a plan view, and an embedded battery disposed on the first surface of the display panel, spaced apart from the thermoelectric element, and electrically connected to the driver chip and the thermoelectric element to supply power to the driver chip and the thermoelectric element.

14 Claims, 6 Drawing Sheets

DISPLAY MODULE

This application claims priority to Korean Patent Application No. 10-2020-0013362, filed on Feb. 4, 2020, and all the benefits accruing therefrom under 35 U.S.C. § 119, the content of which in its entirety is herein incorporated by reference.

BACKGROUND

1. Technical Field

Exemplary embodiments of the invention relate to a display module.

2. Related Art

A display module includes a display panel which includes pixels, and a driver chip (or a driving integrated circuit) that operates the pixels. The driver chip provides the pixels with a data voltage that corresponds to input image data provided from the outside, and the pixels emit light according to the data voltage.

According to power consumption of the driver chip, heat concentration occurs in in a part of the display module where the driver chip is located, and the heat is diffused and dissipated through a heat dissipation sheet (or a heat radiation sheet) which is attached to the rear side of the display module.

SUMMARY

As performance of the display module and the driver chip is improved, power consumption and heat generation of the driver chip increase. Heat capacity to which a heat dissipation sheet may dissipate heat has been limited, and more active technology of cooling other than the heat dissipation sheet, which is a passive cooling technology, is preferable.

The present disclosure provides a display module that may diffuse or dissipate the heat generated within the driver chip more effectively.

According to an exemplary embodiment, a display module comprises a display panel on which an image is displayed, a driver chip which supplies a driving voltage to the display panel, a thermoelectric element disposed on a first surface of the display panel and which overlaps the driver chip in a plan view, and an embedded battery disposed on the first surface of the display panel, spaced apart from the thermoelectric element, and electrically connected to the driver chip and the thermoelectric element to supply power to the driver chip and the thermoelectric element.

In an exemplary embodiment, the display module may further comprise a printed circuit board disposed between the display panel and the thermoelectric element and connected to the display panel and the driver chip, where the embedded battery may be charged by being connected to an external power source through the printed circuit board, and where the embedded battery may supply the power to the driver chip and the thermoelectric element through the printed circuit board.

In an exemplary embodiment, a second surface of the thermoelectric element adjacent to the display panel may be a cooling section, and a first surface of the thermoelectric element opposite to the second surface may be a heating section.

In an exemplary embodiment, the display module may further comprise an energy conversion device disposed on the first surface of the display panel, and a heat pipe disposed on the first surface of the display panel and which overlaps the thermoelectric element and the energy conversion device in the plan view, where the heat pipe may absorb heat from the thermoelectric element and may dissipate the heat to the energy conversion device, and where the energy conversion device may convert the dissipated heat to electric energy and may supply the electric energy to the embedded battery.

In an exemplary embodiment, the heat pipe may comprise a plurality of sub heat pipes which extend from the thermoelectric element towards the energy conversion device and are arranged in parallel with each other.

In an exemplary embodiment, the energy conversion device may be disposed between the thermoelectric element and the embedded battery.

In an exemplary embodiment, the energy conversion device may comprise a Seebeck element.

In an exemplary embodiment, the display module may further comprise a first heat dissipation sheet disposed between the thermoelectric element and the heat pipe.

In an exemplary embodiment, the first heat dissipation sheet may comprise a graphite material.

In an exemplary embodiment, the display module may further comprise a second heat dissipation sheet disposed between the display panel and the embedded battery.

In an exemplary embodiment, the display module may further comprise an energy conversion device disposed on the first surface of the display panel, and a heat dissipation sheet disposed on the first surface of the display panel and which overlaps the thermoelectric element and the energy conversion device in the plan view, where the energy conversion device may convert heat dissipated from the heat dissipation sheet to electric energy and may supply the electric energy to the embedded battery.

In an exemplary embodiment, the energy conversion device may be disposed between the thermoelectric element and the embedded battery.

In an exemplary embodiment, the energy conversion device may overlap the thermoelectric element with the heat dissipation sheet interposed therebetween.

In an exemplary embodiment, the display module may further comprise a heat dissipation sheet disposed on the first surface of the display panel and which overlaps the thermoelectric element in the plan view.

In an exemplary embodiment, the heat dissipation sheet overlaps the embedded battery in the plan view.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION

Figure 1:
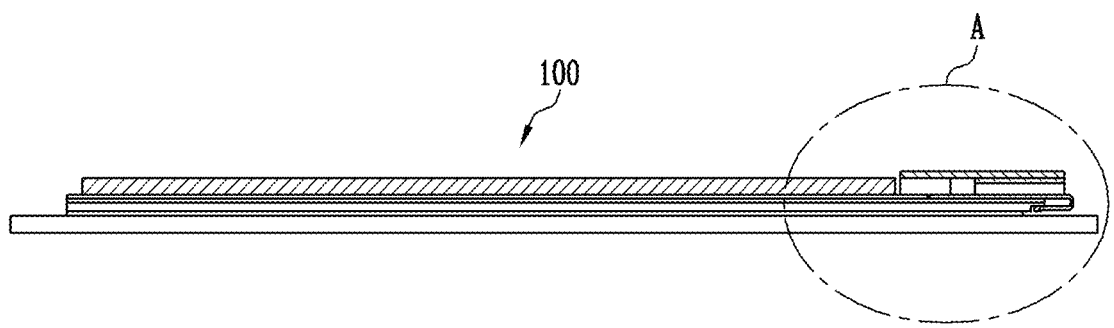
FIG. 1 is a side view that illustrates a display module according to one embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In order to clearly illustrate the invention, parts that are not related to the description are omitted, and the same or similar components are denoted by the same reference numerals throughout the specification. Therefore, the above-mentioned reference numerals may be used in other drawings.

In addition, the size and thickness of each component shown in the drawings are arbitrarily shown for convenience of explanation, and thus the invention is not necessarily limited to those shown in the drawings. In the drawings, thicknesses may be exaggerated for clarity of presentation of layers and regions.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 2:
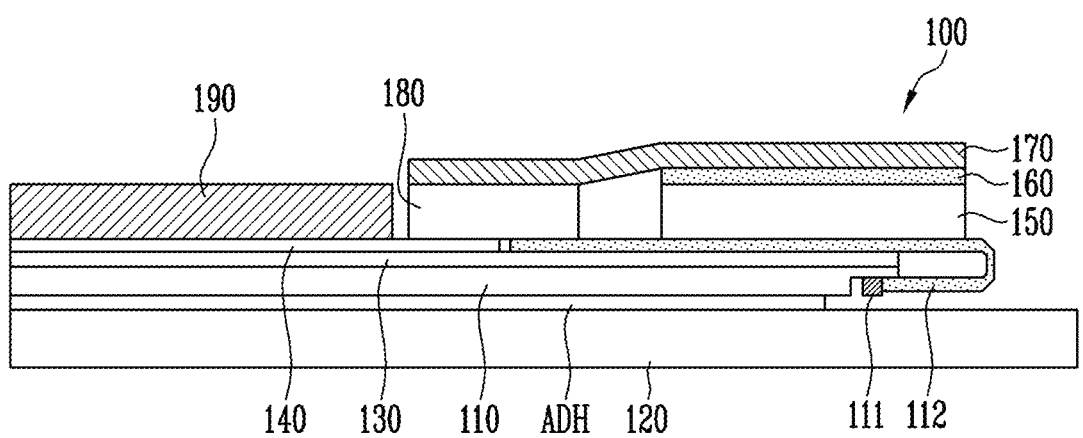
FIG. 2 is an enlarged view of a part A of FIG. 1.
Figure 3:
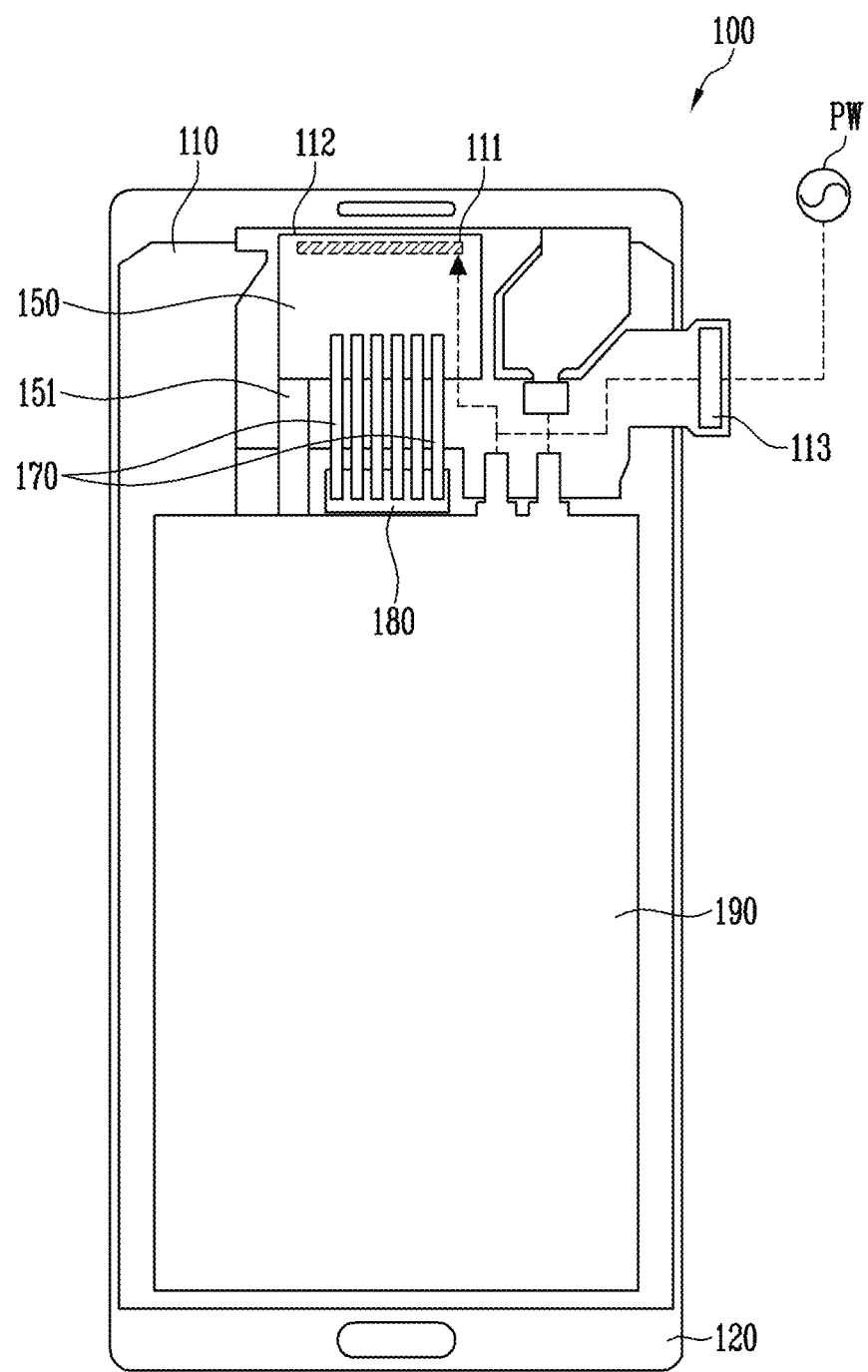
FIG. 3 is a plan view of a display module.
Figure 4:
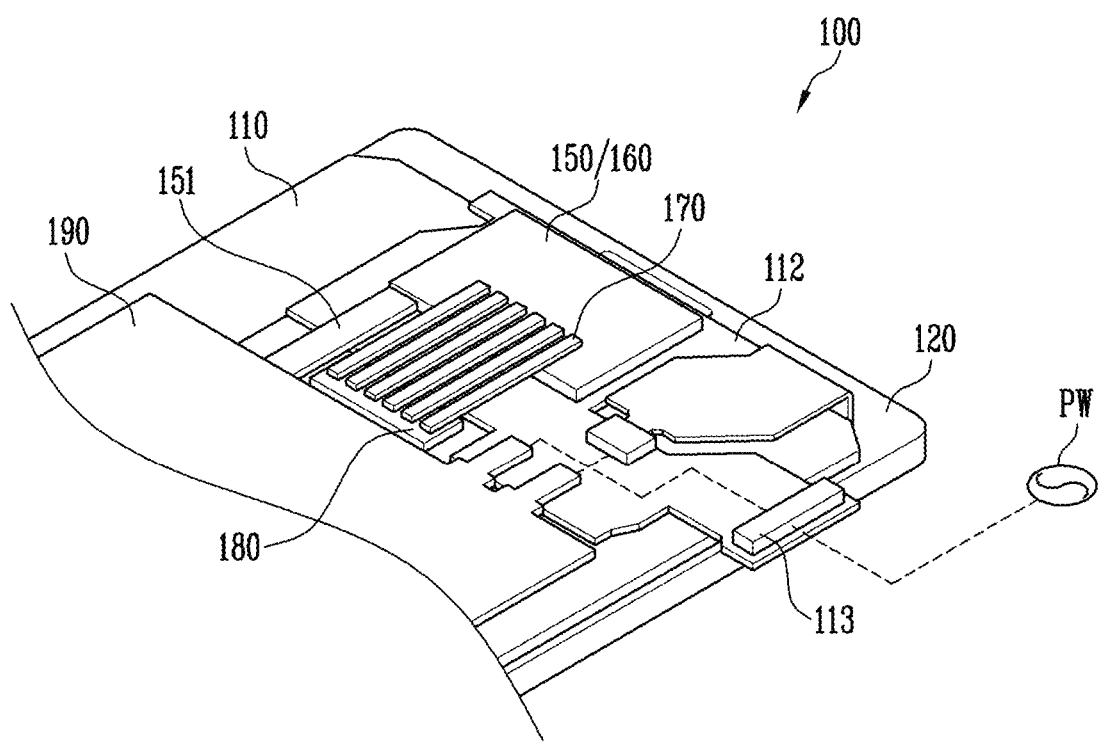
FIG. 4 is a perspective view which illustrates a display module of FIG. 2.

FIG. 1 is a side view of a display module in accordance with one exemplary embodiment of the invention. FIG. 2 is an enlarged view of a part A of FIG. 1. FIG. 3 is a plan view which illustrates the display module of FIG. 1, and FIG. 4 illustrates a perspective view of the display module of FIG. 2. Therefore, FIG. 1 and FIG. 2 illustrate a profile structure of the display module, FIG. 3 illustrates a plan structure of the display module, and FIG. 4 illustrates a three-dimensional structure of the display module.

Referring to FIG. 1 to FIG. 4, a display module 100 may comprise a display panel 110, a driver chip 111 (or a driving chip), a printed circuit board 112 (or a flexible printed circuit board), a window 120 (or a window module), a cover sheet 130, a second heat dissipation sheet 140, a thermoelectric element 150 (e.g., a Peltier module), a first heat dissipation sheet 160, a heat pipe 170, an energy conversion device 180 (or an energy converter), and an embedded battery 190.

The display panel 110 may include a plurality of pixels which are disposed on a board and may display an image by combining colors and luminance of the pixels. For example, the display panel 110 may display an image through its bottom surface (i.e., a second surface) which is adjacent to the window 120.

For example, each pixel may include a light emitting element and a pixel circuit which supplies a driving current to the light emitting element (e.g., a pixel circuit which includes a plurality of transistors and at least one capacitor). For example, the light emitting element may be an organic light emitting element (e.g., an organic light emitting diode). In another example, the light emitting element may be an inorganic light emitting element.

The board may include a material having flexibility so that it can be bent or folded, and may have a structure of single or multiple layers. For example, the board may include polyethyeleneterepthalate ("PET") or polyimide ("PI").

The driver chip 111 (e.g., a panel driver IC) may be adjacent to one side of the display panel 110 and may supply a data voltage (or a driving voltage) to the display panel 110. For example, the driver chip 111 may include a timing controller and a source driver. The timing controller may convert input image data received from the outside (e.g., from an application processor, or a graphic processor) to image data according to the arrangement of the pixels in the display panel 110, and the source driver may generate a data voltage based on the image data.

The driver chip 111 may either be mounted directly onto the display panel 110, or be mounted on the printed circuit board 112 to be connected to the display panel 110 through the printed circuit board 112. Also, the driver chip 111 may be disposed under the bottom surface (i.e., the second surface) of the display panel 110, or may be located over a top surface (i.e., a first surface) of the display panel 110 while being mounted onto the printed circuit board 112. Here, the "bottom surface" and the "top surface" refer to the locations in FIG. 2.

On the other hand, the display panel 110 may detect a touch input (e.g., a touch input signal by a touch of a user's finger), and the driver chip 111 may calculate the location of the touch input. For example, the display panel 110 may comprise touch electrodes (or a touch electrode layer) which are located near the window 120, and the driver chip 111 may detect the location of the touch input based on the change in capacitance and the change in resistance of each of the touch electrodes. In another exemplary embodiment, the display module 100 may further comprise a touch driver chip which calculates the location of a touch, in addition to the driver chip 111.

The printed circuit board 112 may be disposed between the display panel 110 and the thermoelectric element 150, and is connected to the display panel 110 and the driver chip 111. The printed circuit board 112 may connect at least two among the display panel 110, the driver chip 111, the embedded battery 190, and an external power PW to each other. When the display module 100 is included in a smartphone, the external power PW may be a power supply device (and/or a battery) for the overall operation of the smartphone.

As illustrated in FIG. 2, one end portion of the printed circuit board 112 may be connect to one end (and the bottom surface) of the display panel 110 and/or one end of the driver chip 111, and the middle part of the printed circuit board 112 may be folded so that the other end portion of the printed circuit board 112 may be disposed on the top surface of the display panel 110. As illustrated in FIG. 3, the driver chip 111 may receive power from the external power PW through a first connector 113 and the printed circuit board 112 (or a wiring within the printed circuit board 112). The driver chip 111 may receive and be charged with power from the embedded battery 190 through the printed circuit board 112. The embedded battery 190 may supply its own power to the driver chip 111.

In an exemplary embodiment, the printed circuit board 112 may electrically connect to the energy conversion device 180 and the embedded battery 190, or may connect the thermoelectric element 150 to the embedded battery 190. That is, the energy conversion device 180 may supply power to the embedded battery 190 through the printed circuit board 112, or the embedded battery 190 may supply the power (or current) to the thermoelectric element 150 through the printed circuit board 112.

The window 120 may be provided under the display panel 110 and may be attached to the display panel 110 by an adhesive ADH. For example, the adhesive ADH may be an optically clear adhesive ("OCA") or an optically clear resin ("ORC"). Materials of the window 120 may be glass, sapphire, plastic, etc. The window 120 may be of single or multiple layers. The window 120 may include a functional coated layer such as an anti-fingerprint layer, an anti-reflection layer, and a hard-coated layer.

The cover sheet 130 may be provided on the display panel 110 and may protect the top surface (i.e., the first surface) of the display panel 110.

The second heat dissipation sheet 140 may be disposed on the cover sheet 130. The second heat dissipation sheet 140 may dissipate the heat from the embedded battery 190 to the outside. For example, the second heat dissipation sheet 140 may include a graphite material.

The thermoelectric element 150 (or a thermoelectric element module) may be disposed on the top surface of the display panel 110 and may overlap the driver chip 111 in a thickness direction of the display panel 110 (or in a plan view). When the driver chip 111 is mounted on the printed circuit board 112 and disposed on the top surface of the display panel 110, the thermoelectric element 150 may be disposed to directly cover the driver chip 111. As illustrated in FIG. 3, the thermoelectric element 150 may be disposed to cover a part of the display panel 110 where the driver chip 111 is disposed. In another exemplary embodiment, when the display module 100 includes a touch driver chip and other circuits (e.g., a circuit that dissipates heat due to relatively high-power consumption), the thermoelectric element 150 may be disposed to cover the touch driver chip and other circuits.

As illustrated in FIGS. 3 and 4, the thermoelectric element 150 may connect directly to the embedded battery 190 through a second connector 151 and may receive power from the embedded battery 190. However, the invention is not limited thereto, and the thermoelectric element 150 may be connected to the embedded battery 190 through the printed circuit board 112 in another exemplary embodiment.

The thermoelectric element 150 may include a Peltier element which utilizes the Peltier effect which absorbs and dissipates the heat by electric current.

A bottom surface (i.e., a second surface) of the thermoelectric element 150 may be a cooling section, and a top surface (i.e., a first surface opposite to the second surface) may be a heating section. That is, when power (or current) is supplied to the thermoelectric element 150 from the embedded battery 190, the bottom surface of the thermoelectric element 150 may absorbs the heat, and the top surface of the thermoelectric element 150 may dissipate the heat. In this case, the thermoelectric element 150 may quickly absorb heat generated by the driver chip 111, or may quickly cool a part (i.e., the part where the driver chip 111 is located) of the display panel 110.

In an exemplary embodiment, the thermoelectric element 150 may operate based on the temperature (e.g., the temperature at the location of the driver chip 111 or the thermoelectric element 150) measured by a separate temperature sensor. For example, when the measured temperature is higher than the reference temperature, the embedded battery 190 may supply current to the thermoelectric element 150, and when the measure temperature is lower than the reference temperature, the embedded battery 190 may not supply the current to the thermoelectric element 150.

The first heat dissipation sheet 160 (or a heat absorbing plate, or a heatsink) may be disposed on the top surface of the thermoelectric element 150. As illustrated in FIG. 2, the first heat dissipation sheet 160 may be disposed between the thermoelectric element 150 and the heat pipe 170.

The first heat dissipation sheet 160 may quickly absorb or dissipate the heat from the top surface of the thermoelectric element 150. The first heat dissipation sheet 160 may include the thermal interface material which has high thermal conductivity. For example, the first heat dissipation sheet 160 may include a graphite material. The first heat dissipation sheet 160 may attach the thermoelectric element 150 and the heat pipe 170 to each other.

The heat pipe 170 may be disposed on the top surface of the display panel 110 and may overlap the thermoelectric element 150 and the energy conversion device 180 in the plan view.

As illustrated in FIG. 2, the heat pipe 170 may be disposed directly on the first heat dissipation sheet 160 (i.e., on the first heat dissipation sheet 160 disposed on the thermoelectric element 150). The heat pipe 170 may entirely or partially cover the first heat dissipation sheet 160. Also, the heat pipe 170 may be disposed on the energy conversion device 180 and may be in contact with the energy conversion device 180.

The heat pipe 170 may absorb heat from the thermoelectric element 150 through the first heat dissipation sheet 160 and may dissipate the absorbed heat to the energy conversion device 180.

The heat pipe 170 may include sub heat pipes that extend towards the energy conversion device 180 from the thermoelectric element 150 and are arranged in parallel with each other. That is, the heat pipe 170 may be implemented as a multi-heat pipe assembly.

The specific structure of the heat pipe 170 (or the sub heat pipes) will be described below with reference to FIG. 5.

The embodiment of the invention is not limited to the previous description that the heat pipe 170 is disposed to cover the thermoelectric element 150 and the energy conversion device 180. The heat pipe 170 may be disposed between the thermoelectric element 150 and the energy conversion device 180, according to another exemplary embodiment. The heating section of the thermoelectric element 150 is provided on at least one side of the thermoelectric element 150, and the heat absorbing section of the energy conversion device 180 may be provided on at least one side of the energy conversion device 180.

The energy conversion device 180 may be disposed on the top surface of the display panel 110. As illustrated in FIG. 2, FIG. 3, and FIG. 4, the energy conversion device 180 may be disposed between the thermoelectric element 150 and the embedded battery 190 and on the top surface of the display panel 110. That is, the energy conversion device 180, the thermoelectric element 150, and the embedded battery 190 may be disposed in the same layer.

The energy conversion device 180 may convert the heat (i.e., the thermal energy) dissipated from the heat pipe 170 to electric energy. The energy conversion device 180 may provide the electric energy to the embedded battery 190.

The energy conversion device 180 may include a Seebeck element (or a thermoelectric element) which uses the Seebeck effect which is a phenomenon of occurrence of electromotance (i.e., electromotive force) by the difference in temperature.

The embedded battery 190 may be disposed on the top surface of the display panel 110 and may be separated from the thermoelectric element 150. The embedded battery 190 may be implemented as a general battery device which is charged with external power and which provides power to the outside. As illustrated in FIGS. 1 and 3, the embedded battery 190 may be implemented in the form of a sheet. The embedded battery 190 may have a relatively small volume because it requires a relatively small capacity for an emergency operation of the driver chip 111 and for an operation of the thermoelectric element 150.

As illustrated from FIG. 1 to FIG. 4, the display module 100 may cool a part of the display panel 110, on which the driver chip 111 is mounted, more effectively through the thermoelectric element 150 which is disposed on the part of the display panel 110. In addition, the display module 100 may dissipate the heat to the outside through the first heat dissipation sheet 160 located in contact with the top surface (i.e., the heating section) of the thermoelectric element 150.

Further, the display module 100 may deliver at least some of the heat dissipated from the first heat dissipation sheet 160 to the energy conversion device 180 through the heat pipe 170, the energy conversion device 180 may convert the received thermal energy to the electric energy, and the embedded battery 190 may store the converted electric energy and may operate the thermoelectric element 150 by using the stored electric energy. Therefore, the energy efficiency of the display module 100 may be increased.

Figure 5:
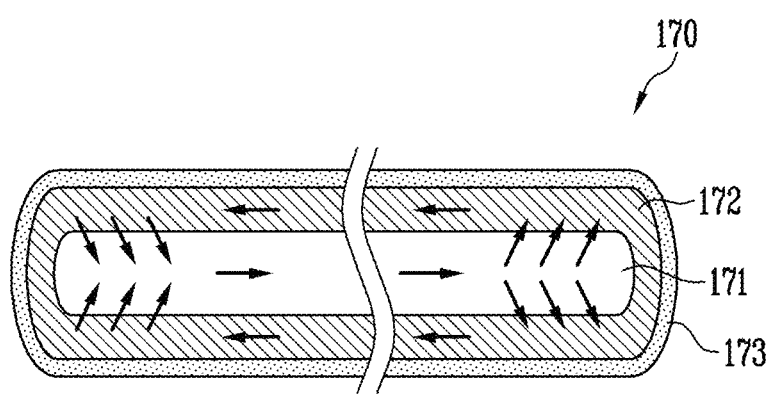
FIG. 5 illustrates an example of the display module of FIG. 2 which includes a heat pipe of FIG. 2.

FIG. 5 illustrates an example of a heat pipe comprised in the display module of FIG. 2. FIG. 5 illustrates a cross section in the longitudinal direction (i.e., in a direction from the thermoelectric element 150 to the energy conversion device 180) of the heat pipe 170 (or a sub heat pipe) included in the display module of FIG. 2.

Referring to FIG. 5, the heat pipe 170 may comprise a vapor cavity 171, a wick 172, and a thermal conductor 173.

The vapor cavity 171 may change the phase of a working fluid (i.e., refrigerant) therein from liquid to gas using the absorbed heat from the thermoelectric element 150 through the first heat dissipation sheet 160. The heat may be delivered along the vapor cavity 171 to the energy conversion device 180. The wick 172 may surround the vapor cavity 171 and change the phase of the working fluid from gas to liquid by using the dissipated heat from the energy conversion device 180. The heat may be delivered back to the thermoelectric element 150 along the wick 172. The thermal conductor 173 may surround the wick 172. The thermal conductor 173 includes or is formed of a material of high thermal conductivity, for example, gold (Au), carbon (C), or graphite, etc. In FIG. 5, the right end of the heat pipe 170 is connected to the energy conversion device 180, and the left end of the heat pipe 170 is connected to the first heat dissipation sheet 160.

Figure 6:
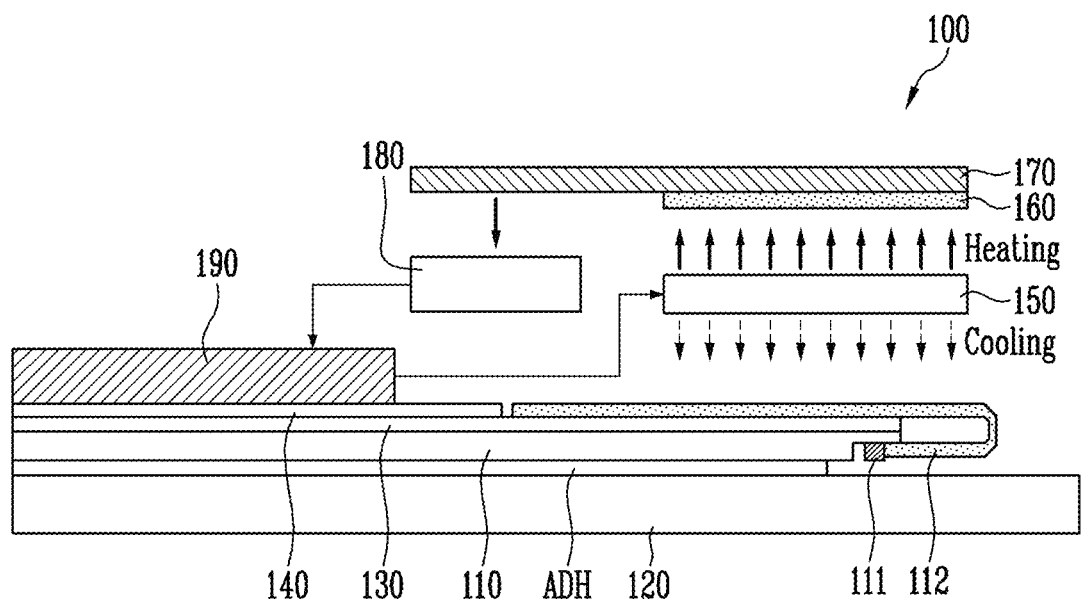
FIG. 6 illustrates flow of energy within a display module of FIG. 2.

FIG. 6 illustrates an energy flow of the display module in FIG. 2. FIG. 6 corresponds to FIG. 2, and the thermoelectric element 150, the heat pipe 170, and the energy conversion device 180 are illustrated separated from the display panel 110 for convenience of explanation.

Referring to FIG. 6, the driver chip 111 may produce heat as a heat source. Some of the heat dissipated from the driver chip 111 may be dissipated through the window 120 to the outside.

The heat dissipated from the driver chip 111 may generally be delivered to the thermoelectric element 150 through the printed circuit board 112 (and the display panel 110). The printed circuit board 112 includes wires including or formed of a material such as copper in a flexible board composed of a material such as polyimide. The heat may be delivered to the thermoelectric element 150 through the printed circuit board 112.

As a cooling section, the bottom surface of the thermoelectric element 150 may absorb heat, or cool the printed circuit board 112 and the driver chip 111. At the same time, as a heating section, the top surface of the thermoelectric element 150 may dissipate heat.

The heat dissipated from the top surface of the thermoelectric element 150 may be absorbed through the first heat dissipation sheet 160 (or a heat absorber plate), and may be delivered or diffused to the heating section (i.e., a part where contacts the first heat dissipation sheet 160) of the heat pipe 170 through the first heat dissipation sheet 160.

The heat delivered to the heat pipe 170 may be delivered to the energy conversion device 180 through the phase change of the working fluid (i.e., a refrigerant) according to the structure of the heat pipe 170 as described in reference to the FIG. 5.

The heat (i.e., thermal energy) delivered to the energy conversion device 180 may be converted to electric energy by the energy conversion device 180, and the converted electric energy may be supplied to the embedded battery 190.

The embedded battery 190 may supply its own power (or current) to the thermoelectric element 150, using the electric energy (or power received from the external power source). Some of the heat generated by operations of the thermoelectric element 150 may be circulated through the first heat dissipation sheet 160, the heat pipe 170, and the energy conversion device 180.

Although not illustrated in FIG. 6, in another exemplary embodiment, for example, the display module 100 may dissipate heat through the top surface of the display module 100 to the outside through the first heat dissipation sheet 160 or through additional heat dissipation materials (e.g., a heat dissipation sheet that covers the entire top surface of the display module 100).

FIGS. 7 to 10 illustrate a display module in accordance with different exemplary embodiments. FIGS. 7 to 10 show lateral structures of the display module corresponding to FIG. 2.

Figure 7:
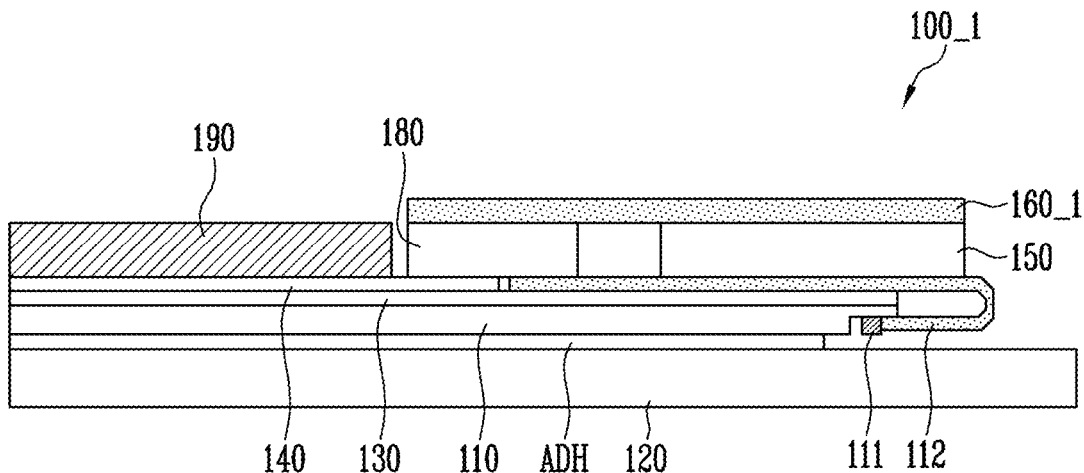
FIGS. 7 to 10 illustrate a display module in accordance with different exemplary embodiments.

Referring to FIGS. 2 and 7, a display module 100_1 is different from the display module 100 in that the display module 100_1 does not include the heat pipe 170. A duplicated description will not be repeated because the display module 100_1 is substantially the same as or similar to the display module 100.

The first heat dissipation sheet 160_1 may be located on the top surface (i.e., the first surface) of the display panel 110 and may overlap the thermoelectric element 150 and the energy conversion device 180 in a plan view. The first heat dissipation sheet 160_1 may cover the thermoelectric element 150 and the energy conversion device 180, and may be in contact with the thermoelectric element 150 and the energy conversion device 180.

The first heat dissipation sheet 160_1 may diffuse the heat dissipated from the thermoelectric element 150 across the entire first heat dissipation sheet 160_1.

Some of the heat dissipated through the first heat dissipation sheet 160_1 may be supplied to the energy conversion device 180.

Although the energy efficiency of the display module 100_1 of FIG. 7 may be relatively low compared to the display module 100 of FIG. 2, a production cost of the display module 100_1 may be lowered than a production cost of the display module 100 due to the absence of the heat pipe 170, and the thickness of the display module 100_1 may be lower than the thickness of the display module 100 of FIG. 2.

Figure 8:
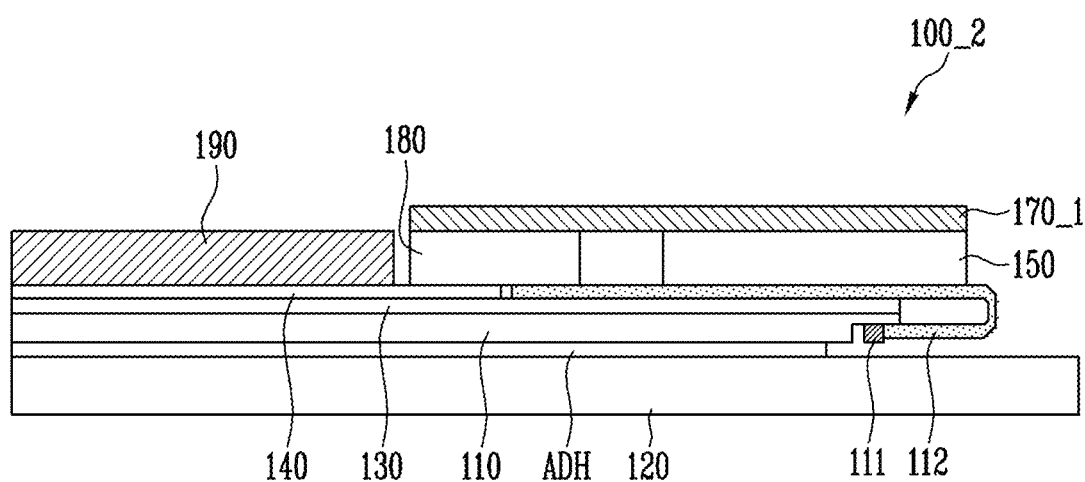

Referring to FIGS. 2 and 8, a display module 100_2 is different from the display module 100 of FIG. 2 because the first heat dissipation sheet 160 is absent from the display module 100_2. However, the duplicated description will not be repeated because the display module 100_2 is substantially the same as or similar to the display module 100 of FIG. 2.

A heat pipe 170_1 may be located on the top surface (i.e., the first surface) of the display panel 110 and may overlap the thermoelectric element 150 and the energy conversion device 180 in a plan view. The heat pipe 170_1 may cover the thermoelectric element 150 and the energy conversion device 180, and may be in contact with the thermoelectric element 150 and the energy conversion device 180.

The heat pipe 170_1 may directly absorb the heat dissipated from the thermoelectric element 150, and may deliver the absorbed heat to the energy conversion device 180.

The display module 100_2 of FIG. 8 may reduce the production cost and may have a relatively reduced thickness, similarly to the display module 100_1 of FIG. 7.

Figure 9:
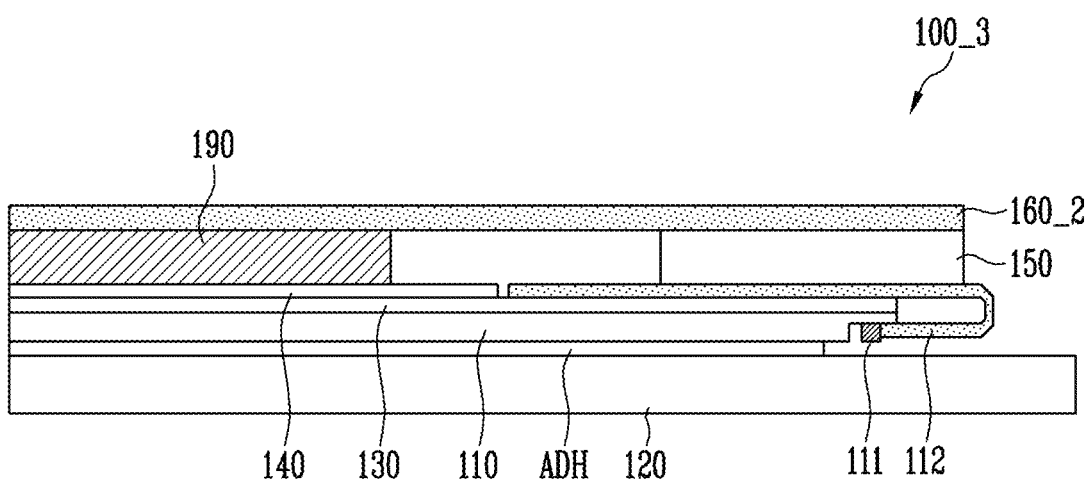

Referring to FIGS. 2 and 9, a display module 100_3 is different from the display module 100 of FIG. 2 in that the heat pipe 170 and the energy conversion device 180 are not included in the display module 100_3. A duplicated description will not be repeated because the display module 100_3 is substantially the same as or similar to the display module 100 of FIG. 2.

A first heat dissipation sheet 160_2 may be located on the top surface (i.e., the first surface) of the display panel 110, and may overlap with the thermoelectric element 150 and the embedded battery 190 in a plan view. The first heat dissipation sheet 160_2 may cover the thermoelectric element 150 and the embedded battery 190, and may be in contact with the thermoelectric element 150 and the embedded battery 190.

The first heat dissipation sheet 160_2 may diffuse the heat dissipated from the thermoelectric element 150 into the entire embedded battery 190 to dissipate the heat to the outside. Also, the first heat dissipation sheet 160_2 may dissipate the heat occurred from embedded battery 190 to the outside in the form of diffusion.

Figure 10:
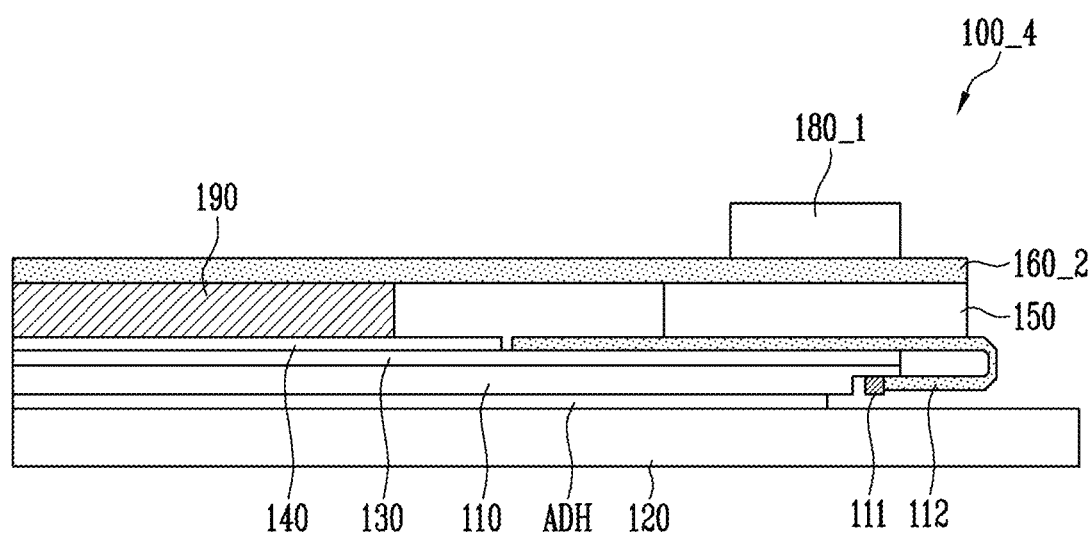

Referring to FIGS. 9 and 10, a display module 100_4 is different from the display module 100_3 of FIG. 9 in that an energy conversion device 180_1 is further included in the display module 100_4. The duplicated description will not be repeated because the display module 100_4 is substantially the same as or similar to the display module 100 of FIG. 2.

The energy conversion device 180_1 may be disposed on the top surface (i.e., the first surface) of the display panel 110, and may overlap the thermoelectric element 150 with the first heat dissipation sheet 160_2 interposed therebetween. That is, the energy conversion device 180_1 may be positioned above the thermoelectric element 150.

The energy conversion device 180_1 may convert the heat diffused through the first heat dissipation sheet 160_2 (i.e., heat dissipated from the thermoelectric element 150 and the embedded battery 190) to electric energy.

Although the first heat dissipation sheet 160_2 is illustrated to be positioned between the thermoelectric element 150 and the energy conversion device 180_1 in FIG. 10, the display module 100_4 is not limited thereto. For example, the display module 100_4 may not include the first heat dissipation sheet 160_2, and the energy conversion device 180_1 may be positioned directly on or in contact with the thermoelectric element 150 in another exemplary embodiment.

The display module in accordance with exemplary embodiments of the invention may more effectively cool an area of the display panel through the thermoelectric element disposed on the area of the display panel on which the driver chip is mounted, and may dissipate the heat through the heat dissipation sheet disposed in contact with the heating section (or a portion where heat is generated) of the thermoelectric element.

Also, the display module may increase energy efficiency by retrieving at least part of the heat dissipated through the thermoelectric element and the heat dissipation sheet through the energy conversion device which converts thermal energy to electrical energy and the embedded battery.

The foregoing description is intended to illustrate and describe the invention. In addition, the foregoing is merely illustrative and explanatory of preferred embodiments of the invention, and as described above, the invention may be used in various other combinations, modifications, and environments. Changes or modifications may be made within the scope of the inventive concepts disclosed herein, within the scope of equivalents to those described and/or within the skill or knowledge of those skilled in the art. Accordingly, the foregoing description of the invention is not intended to limit the invention to the embodiments disclosed. In addition, the appended claims should be construed to include other embodiments.

What is claimed is:

1. A display module comprising:
   a display panel on which an image is displayed;
   a driver chip which supplies a driving voltage to the display panel;
   a thermoelectric element disposed on a first surface of the display panel and which overlaps the driver chip in a plan view;
   an embedded battery disposed on the first surface of the display panel, spaced apart from the thermoelectric element, and electrically connected to the driver chip and the thermoelectric element to supply power to the driver chip and the thermoelectric element;
   an energy conversion device disposed on the first surface of the display panel; and
   a heat pipe disposed on the first surface of the display panel and which overlaps the thermoelectric element and the energy conversion device in the plan view,
   wherein the heat pipe absorbs heat from the thermoelectric element and dissipates the heat to the energy conversion device, and
   wherein the energy conversion device converts the dissipated heat to electric energy and supplies the electric energy to the embedded batter.

2. The display module of claim 1, further comprising:
   a printed circuit board disposed between the display panel and the thermoelectric element and connected to the display panel and the driver chip,
   wherein the embedded battery is charged by being connected to an external power source through the printed circuit board, and
   wherein the embedded battery supplies the power to the driver chip and the thermoelectric element through the printed circuit board.

3. The display module of claim 2, further comprising:
   a heat dissipation sheet disposed on the first surface of the display panel and which overlaps the thermoelectric element in the plan view.

4. The display module of claim 3, wherein the heat dissipation sheet overlaps the embedded battery in the plan view.

5. The display module of claim 1, wherein a second surface of the thermoelectric element adjacent to the display panel is a cooling section, and a first surface of the thermoelectric element opposite to the second surface is a heating section.

6. The display module of claim 1, wherein the heat pipe comprises a plurality of sub heat pipes which extend from the thermoelectric element towards the energy conversion device and are arranged in parallel with each other.

7. The display module of claim 1, wherein the energy conversion device is disposed between the thermoelectric element and the embedded battery.

8. The display module of claim 7, wherein the energy conversion device comprises a Seebeck element.

9. The display module of claim 7, further comprising:
   a first heat dissipation sheet disposed between the thermoelectric element and the heat pipe.

10. The display module of claim 9, wherein the first heat dissipation sheet comprises a graphite material.

11. The display module of claim 9, further comprising:
    a second heat dissipation sheet disposed between the display panel and the embedded battery.

12. A display module comprising:
    a display panel on which an image is displayed;
    a driver chip which supplies a driving voltage to the display panel;
    a thermoelectric element disposed on a first surface of the display panel and which overlaps the driver chip in a plan view;
    an embedded battery disposed on the first surface of the display panel, spaced apart from the thermoelectric element, and electrically connected to the driver chip and the thermoelectric element to supply power to the driver chip and the thermoelectric element;
    an energy conversion device disposed on the first surface of the display panel; and
    a heat dissipation sheet disposed on the first surface of the display panel and which overlaps the thermoelectric element and the energy conversion device in the plan view,
    wherein the energy conversion device converts heat dissipated from the heat dissipation sheet to electric energy and supplies the electric energy to the embedded battery.

13. The display module of claim 12, wherein the energy conversion device is disposed between the thermoelectric element and the embedded battery.

14. The display module of claim 12, wherein the energy conversion device overlaps the thermoelectric element with the heat dissipation sheet interposed therebetween.

* * * * *